(12) United States Patent
Shafer et al.

(10) Patent No.: US 6,717,722 B2
(45) Date of Patent: Apr. 6, 2004

(54) CATADIOPTRIC OPTICAL SYSTEM AND EXPOSURE APPARATUS HAVING THE SAME

(75) Inventors: David R. Shafer, Fairfield, CT (US); Helmut Beierl, Heidenheim (DE); Gerhard Fürter, Ellwangen (DE); Karl-Heinz Schuster, Königsbronn (DE); Wilhelm Ulrich, Aalen (DE)

(73) Assignee: Car Zeiss, Heidenheim (Brenz) (DE)

( * ) Notice: Subject to any disclaimer, the term of this patent is extended or adjusted under 35 U.S.C. 154(b) by 53 days.

(21) Appl. No.: 10/079,964

(22) Filed: Feb. 20, 2002

(65) Prior Publication Data

US 2002/0196533 A1 Dec. 26, 2002

Related U.S. Application Data

(62) Division of application No. 09/364,382, filed on Jul. 29, 1999.
(60) Provisional application No. 60/094,579, filed on Jul. 29, 1998.

(51) Int. Cl.[7] .............................................. G02B 13/14
(52) U.S. Cl. ..................... 359/355; 359/364; 359/365; 359/366

(58) Field of Search ................................. 359/355, 364, 359/365, 366, 727, 728, 732, 350, 356, 357, 726

(56) References Cited

U.S. PATENT DOCUMENTS

| | | | | |
|---|---|---|---|---|
| 5,323,263 A | * | 6/1994 | Schoenmakers | 359/366 |
| 5,592,329 A | * | 1/1997 | Ishiyama et al. | 359/399 |
| 5,689,377 A | | 11/1997 | Takahashi | |
| 5,691,802 A | | 11/1997 | Takahashi | |
| 5,694,241 A | | 12/1997 | Ishiyama et al. | |
| 5,844,728 A | * | 12/1998 | Hashimoto et al. | 359/727 |
| 5,861,997 A | | 1/1999 | Takahashi | |
| 6,392,822 B1 | * | 5/2002 | Takahashi | 359/728 |

FOREIGN PATENT DOCUMENTS

JP  8-62502  8/1994  ........... G02B/17/08

* cited by examiner

*Primary Examiner*—Mohammad Sikder

(57) ABSTRACT

A projection exposure lens system has an object side catadioptric system, and intermediate image and a refractive lens system. The refractive lens system from its intermediate image side and in the direction of its image plane has a first lens group of positive refractive power, a second lens group of negative refractive power, a third lens group of positive refractive power, a fourth lens group of negative refractive power, and a fifth lens group of positive refractive power.

33 Claims, 7 Drawing Sheets

CATADIOPTRIC OPTICAL SYSTEM AND EXPOSURE APPARATUS HAVING THE SAME

This application is a Division of Ser. No. 09/364,382 filed Jul. 29, 1999 now U.S. Pat. No. 6,496,306 which claims benefit of Ser. No. 60/094,579 filed Jul. 29, 1998.

BACKGROUND OF THE INVENTION

1. Field of the Invention

The present invention relates to a projection exposure lens in a projection exposure apparatus such as a wafer scanner or a wafer stepper used to manufacture semiconductor elements or other microstructure devices by photolithography and, more particularly, to a catadioptric projection optical lens with an object side catadioptric system, an intermediate image and a refractive lens system for use in such a projection exposure apparatus.

2. Related Background Art

U.S. Pat. No. 4,779,966 to Friedman gives an early example of such a lens, however the catadioptric system being arranged on the image side. Its development starting from the principle of a Schupmann achromat is described. It is an issue of this patent to avoid a second lens material, consequently all lenses are of fused silica. Light source is not specified, band width is limited to 1 nm.

U.S. Pat. No. 5,052,763 to Singh (EP 0 475 020) is another example. Here it is relevant that odd aberrations are substantially corrected separately by each subsystem, wherefore it is preferred that the catadioptric system is a 1:1 system and no lens is arranged between the object and the first deflecting mirror. A shell is placed between the first deflecting mirror and the concave mirror in a position more near to the deflecting mirror. All examples provide only fused silica lenses. NA is extended to 0.7 and a 248 nm excimer laser or others are proposed. Line narrowing of the laser is proposed as sufficient to avoid chromatic correction by use of different lens materials.

U.S. Pat. No 5,691,802 to Takahashi is another example, where a first optical element group having positive refracting power between the first deflecting mirror and the concave mirror is requested. This is to reduce the diameter of the mirror, and therefore this positive lens is located near the first deflecting mirror. All examples show a great number of $CaF_2$ lenses.

EP 0 736 789 A to Takahashi is an example, where it is requested that between the first deflecting mirror and the concave mirror three lens groups are arranged, with plus minus plus refractive power, also with the aim of reducing the diameter of the concave mirror. Therefore, the first positive lens is located rather near to the first reflecting mirror. Also many $CaF_2$ lenses are used for achromatization.

DE 197 26 058 A to Omura describes a system where the catadioptric system has a reduction ratio of $0.75 < |\beta_1| < 0.95$ and a certain relation for the geometry of this system is fulfilled as well. Also many $CaF_2$ lenses are used for achromatization.

For purely refractive lenses of microlithography projection exposure system a lens design where the light beam is twice widened strongly is well known, see e.g. Glatzel, E., Zeiss-Information 26 (1981), No. 92 pages 8–13. A recent example of such a projection lens with +−+−+ lens groups is given in EP 0 770 895 to Matsuzawa and Suenaga.

The refractive partial objectives of the known catadioptric lenses of the generic type of the invention, however show much simpler constructions.

The contents of these documents are incorporated herein by reference. They give background and circumstances of the system according to the invention.

SUMMARY OF THE INVENTION

It is an object of the present invention to obtain a catadioptric optical system of new construction principles allowing for large numerical aperture, large image field, sufficient laser bandwidth, solid and stable construction, which takes into account the present limitations on availability of $CaF_2$ in quantity and quality. This holds for a DUV projection lens and gives the basis for a one material only lens for VUV (157 nm).

In order to achieve the above object, according to the present invention, there is provided a projection exposure lens according to one of claims 1 to 7 or any combination of them as claimed in claim 8.

Advantageous versions are obtained when including features of one or more of the dependent claims 8 to 28.

An advantageous projection exposure apparatus of claim 29 is obtained by incorporating a projection exposure lens according to at least one of claims 1 to 28 into a known apparatus.

A method of producing microstructured devices by lithography (claim 30) according to the invention is characterized by the use of a projection exposure apparatus according to the preceeding claim 29. Claim 31 gives an advantageous mode of this method.

The present invention will be more fully understood from the detailed description given hereinbelow and the accompanying drawings, which are given by way of illustration only and are not to be considered as limiting the present invention. Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

Figure 1:
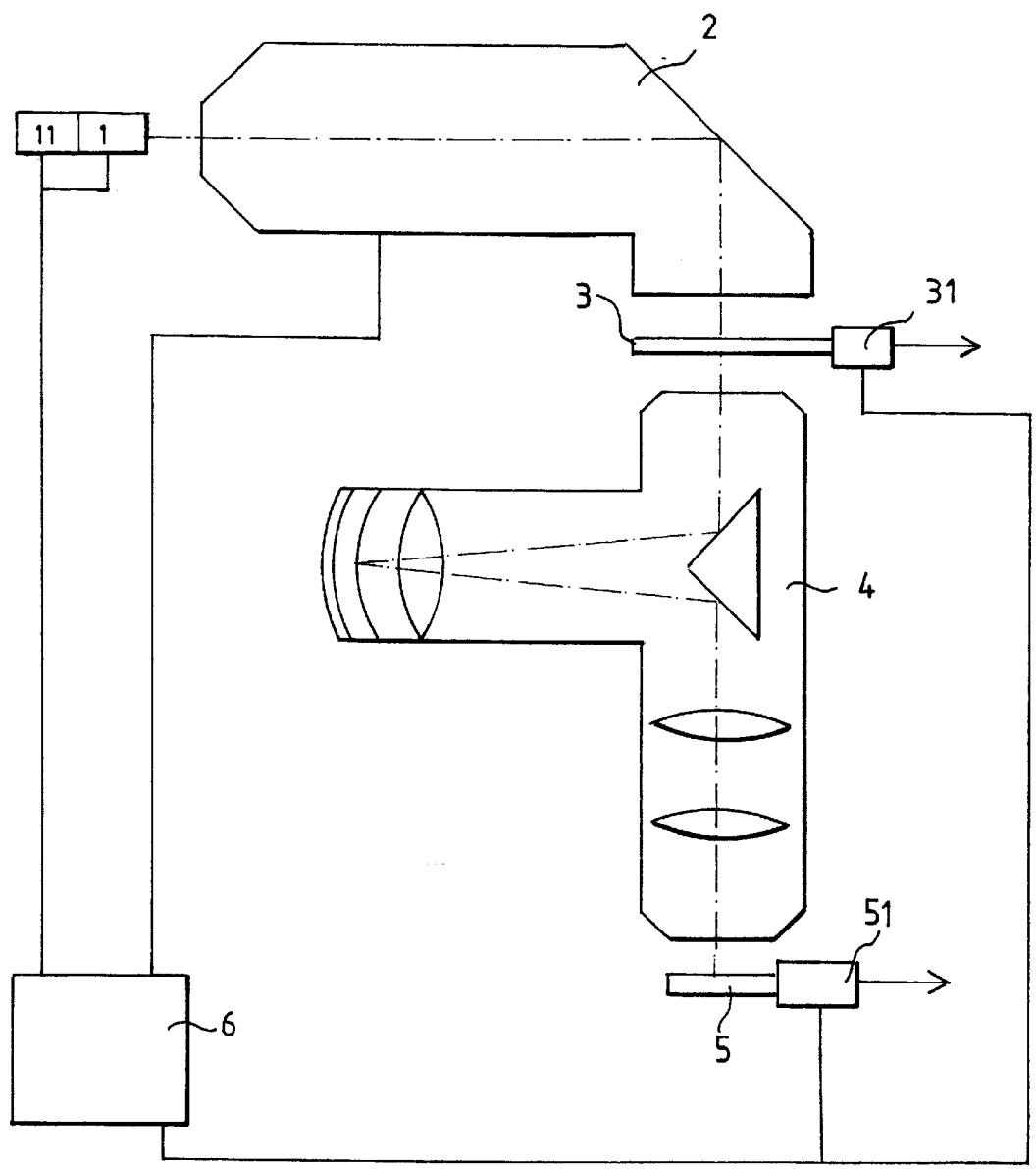
FIG. 1 is a view showing the arrangement of an exposure apparatus to which a catadioptric optical system according to the present invention can be applied.

The projection exposure apparatus as schematically shown in FIG. 1 includes an excimer laser light source 1 with an arrangement 11 moderately narrowing bandwidth. An illumination system 2 produces a large field, sharply limited and illuminated very homogeneously, which matches the telecentricity requirements of the projection lens, and with an illumination mode to choice. Such mode may be conventional illumination of variable degree of coherence, annular or quadrupole illumination.

A mask 3 is displaced in the illuminated area by a mask holding and handling system 31, which includes the scanning drive in case of a wafer scanner projection exposure apparatus. Subsequently follows the catadioptric projection exposure lens 4, according to the invention to be described in detail subsequently.

This lens 4 produces a reduced scale image of the mask 3 on a wafer 5. The wafer 5 is held, handled and eventually scanned by unit 51.

All systems are controlled by control unit 6. Such unit and the method of its use is known in the art of microlithographic projection exposure.

However, for exposure of structures in the regime of about 0.2 μm and less resolution at high throughput there is a demand for various projection exposure lenses capable to be operated at 193 nm, eventually also at 248 nm or 157 nm excimer laser wavelengths with reasonably available bandwidths (e.g. 15 pm at 193 nm), at high image side numerical aperture of 0.65 to 0.8 or more and with reasonably large rectangular or circular scanning image fields of e.g. 7×20 to 10×30 mm².

Catadioptric systems of the type cited above are in principle suitable for this.

However, according to the invention a number of measures and features has been found to improve these systems.

Figure 2:
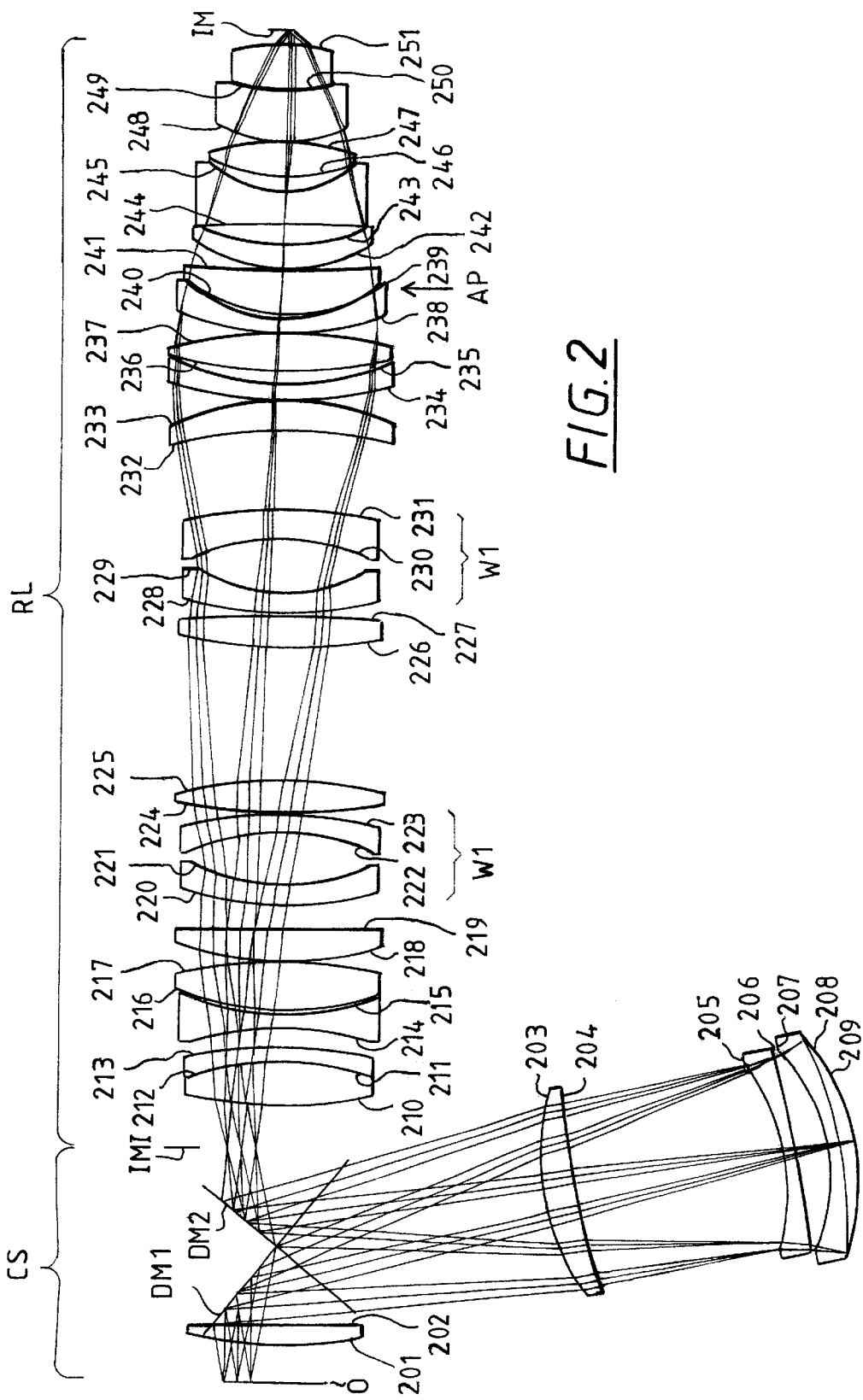
FIG. 2 is a section view of the lens arrangement of a first embodiment.

The example shown in the sectional view of FIG. 2 has the lens data given in Table 1 and makes use only of fused silica lenses. As only one lens material is used, this design can easily be adapted for other wavelengths as 248 nm or 157 nm.

The intermediate image IMI is freely accessible, so that it is easily possible to insert a field stops. The aperture stop AP is located between lens surfaces 239 and 240 and is also well accessible.

The deflecting mirrors DM1 and DM2 in the catadioptric system CS are defined in their geometry by the demands of separation of the light beams to and from the concave mirror 209 and of clearance from lens 201, 202. It is advantageous, that the mirror angle of mirror DM1 differs from 45°, such that the beam deflection angle is greater than 90°. This helps to ascertain large free working distance as well as wide clearance for the light beam relative to the first lens element 201, 202 and also gives full clearance of the lens barrel of the catadioptric systems CS from the object plane 0.

The arrangement of the two deflection mirrors DM1, DM2 allows for a straight optical axis and parallel situation of origin plane 0 and image plane IM, i.e. mask and wafer are parallel and can easily be scanned. However, one of the deflecting mirrors DM1, DM2 can be abandoned or eventually be replaced by a deflecting mirror in the refractive lens RL, e.g. in the air space between lens surfaces 225 and 226. It is also clear that the deflecting mirrors can be replaced by other deflecting optical elements (as e. g. the prism in embodiment 6 or others).

A moderate positive lens 201, 202 is placed near the origin plane 0 in the single pass beam area. Its focal length is approximately equal to its distance from the concave mirror 209. This makes that the concave mirror 209 is situated in a pupil plane and thus the diameter required is minimized.

A second positive lens is located in the doubly passed area between the deflecting mirrors DM1, DM2 and the concave mirror 209. As the production conditions of concave mirrors of 200 mm to 300 mm diameter give no strong preference to smaller units—in contrast to lenses, namely such made from $CaF_2$, where inhomogeneties etc. give strong limitations—there is no need to use this positive lens 203, 204 for reduction of the radius of the concave mirror 209. It is located nearer to the concave mirror 209 than to the first reflection mirror DM1 at a location where it serves best to minimize imaging errors.

The two negative menisci 205, 206; 207, 208 cooperate with the concave mirror 209 in a known manner, giving increased angles of incidence and stronger curvature, thus stronger correcting influence of the concave mirror 209.

It is significant, that the number of lenses in the doubly passed area of the catadioptric system CS is restricted to three, as here every lens counts doubly with respect to system energy transmission and wavefront quality degradation—without giving more degrees of freedom for correction.

Of a total reduction ratio of $\beta=0.25$ the catadioptric system CS delivers its part of $\beta_{cs}=1.008$.

At the intermediate image plane IMI preferably a field stop FS is inserted, which reduces stray light favourably.

The refractive lens RL following to the intermediate image IMI is of more elaborate design than usual in the art. It is more of a quality as fully refractive projection exposure lenses of recent developments tend to be.

One can see that the five lens group design known from sophisticated refractive microlithography lens designs featuring two waists and three bellies with +−+−+ lens groups in this sequence is adopted. Though the first two bellies (lens surfaces 210 to 219, 224 to 227) are not very strongly expressed, the two waists W1, W2 are significantly established, each by a pair of negative menisci 220, 221; 222, 223 and 228, 229; 230, 231, whose convex surfaces face outwardly.

It is known that these lens groups at the waists W1, W2 as the others can be developed further by incorporating more lenses, e.g. to increase the numerical aperture or the image area.

From another point of view, the refractive lens RL is composed of a field lens group (lens surfaces 210 to 219) of positive power for turning the diverging chief ray into a converging chief ray, an image side positive focussing lens group (lens surfaces 232 to 251) which generates the required large numerical aperture, and intermediately arranged lens elements, which correct imaging errors, especially including sets of oppositely arranged negative menisci (w1, w2).

The −+ power doublets with surfaces 235 to 238 and 239 to 242 are the key to the wide spectral bandwidth at good correction of the chromatic variation in spherical aberration, which is the main residual aberration in these designs. It was found that the alternative arrangement there of +− power doublets gives much worse chromatic variation of spherical aberration. Here a value of 0.35 μm is obtained at 15 pm laser bandwidth.

This example of FIG. 2 is suitable for printing microstructures at a resolution of less than 0.2 μm over an image field of 30×7 mm² rectangle at 6 mm off axis, with an excimer laser source of 0.015 nm bandwidth.

Figure 3:
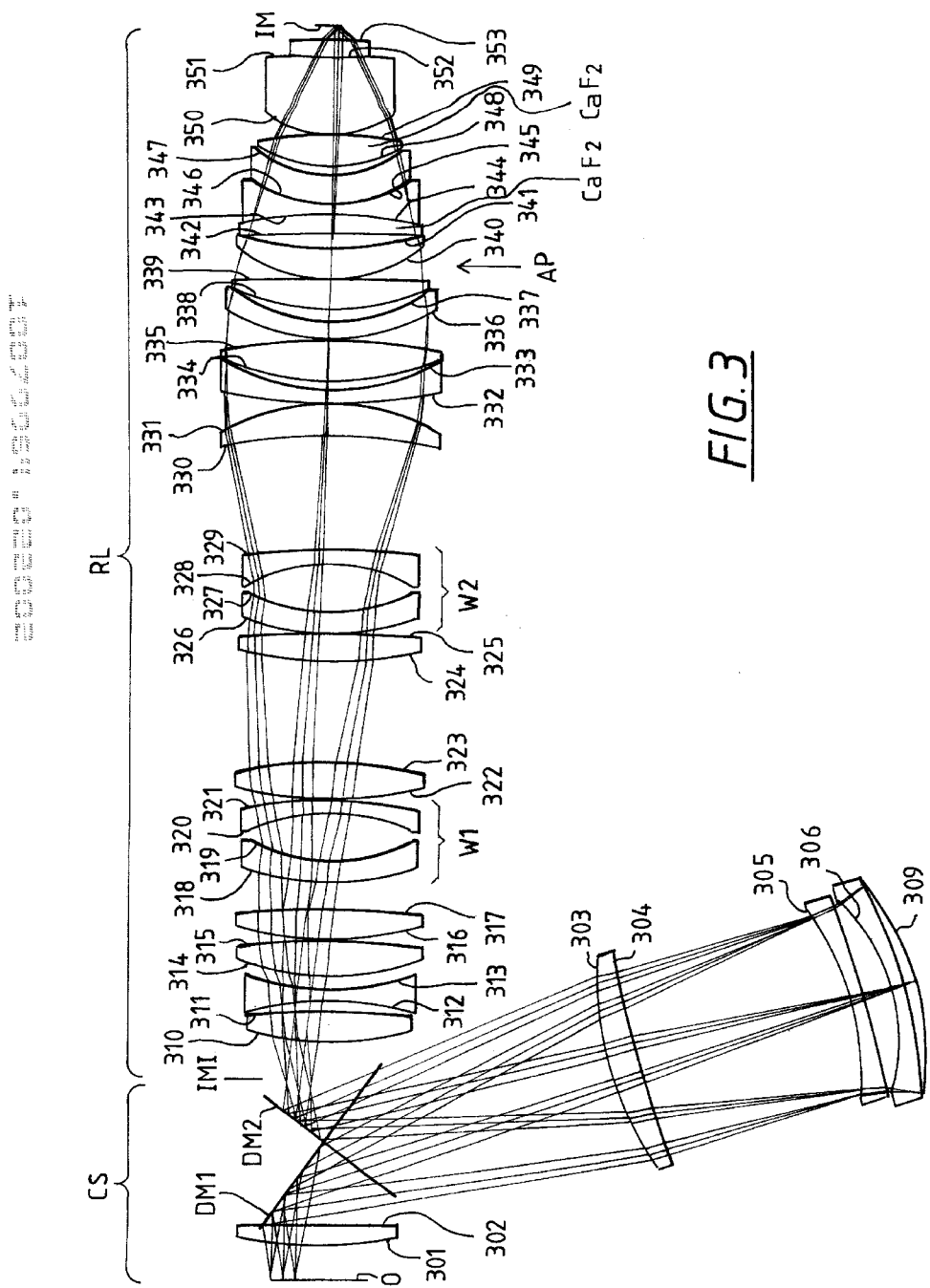
FIG. 3 is a section view of the lens arrangement of a second embodiment.

FIG. 3 and Table 2 show a design variant. The catadioptric system CS remains very similar, however its reduction ratio now is less than unity at $\beta_{cs}=0.944$.

In the refractive lens the second lens 212, 213 of FIG. 2 is abandoned, while the thick negative lens 245, 246 is split into three units 342, 343; 344, 345; 346, 347.

Also two lenses now are made of CaF$_2$, namely the elements with the surfaces 342, 343 and 348, 349. Related to the diameter of the greatest lens 330, 331 of ca. 250 mm their diameters of ca. 205 mm and approx. 165 mm are less than 0.81 fold and 0.67 fold. Therefore, their dimension is not too great and effective production is ascertained.

Also they both are arranged in the converging light beam in the fifth lens group after the third belly, near the image plane. They help with achromatization. The other features are quite similar as those of the example of FIG. 2, including e.g. the −+ power doublets 332 to 339.

Figure 4:
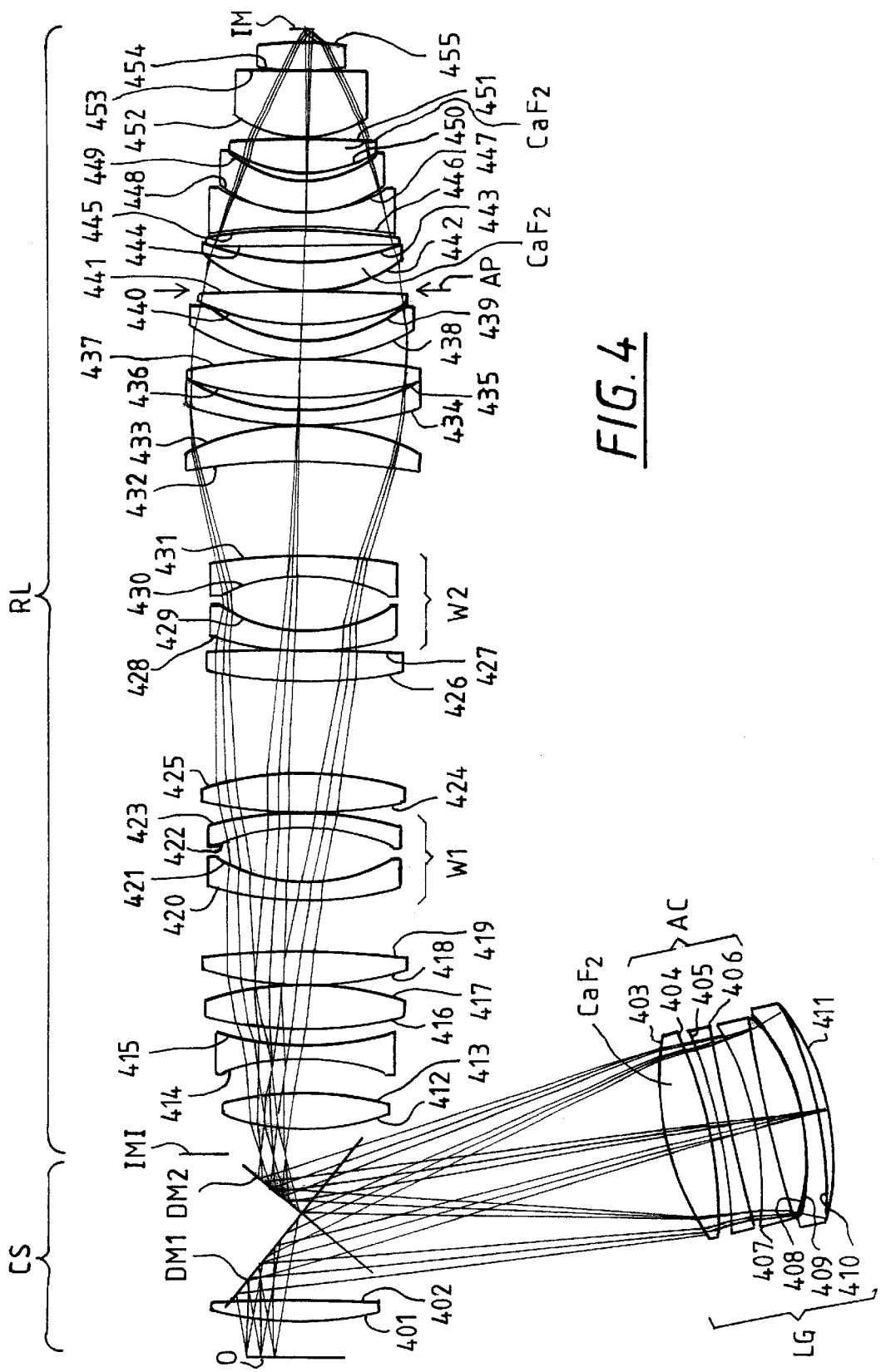
FIG. 4 is a section view of the lens arrangement of a third embodiment.

FIG. 4 and table 3 show another example of a catadioptric lens according to the invention.

Now, the catadioptric system CS shows a major revision, as all lenses in the doubly passed region are combined into a single lens group next to the concave mirror 411. It includes the positive lens 403, 404 and three negative lenses 405 to 410. Change from two to three such negative lenses provides smoother increase of beam angles and thus optimizes correction. Thus, the construction of the lens barrel of the catadioptric system CS is simplified. The lenses 403 to 410 and the mirror 411 can be mounted in a compact unit of conventional construction as known from refractive projection exposure lenses. The long distance to the deflecting mirrors DM1, DM2 can be bridged by a thermally stable tubular body, e.g. made of fiber compound, glass ceramics or a bi-metal compound structure.

The positive lens 403, 404 now is made of fluorite (ca. 200 mm dia.), thus helping in achromatization. It is significant for the invention, that at most three to four lenses in total made of a second material are sufficient to provide good achromatization in this basic design.

The reduction ratio of the catadioptric system is $\beta_{cs}$= 0.931. The refractive lens system is constructed very similar to the one of table 2.

Figure 5:
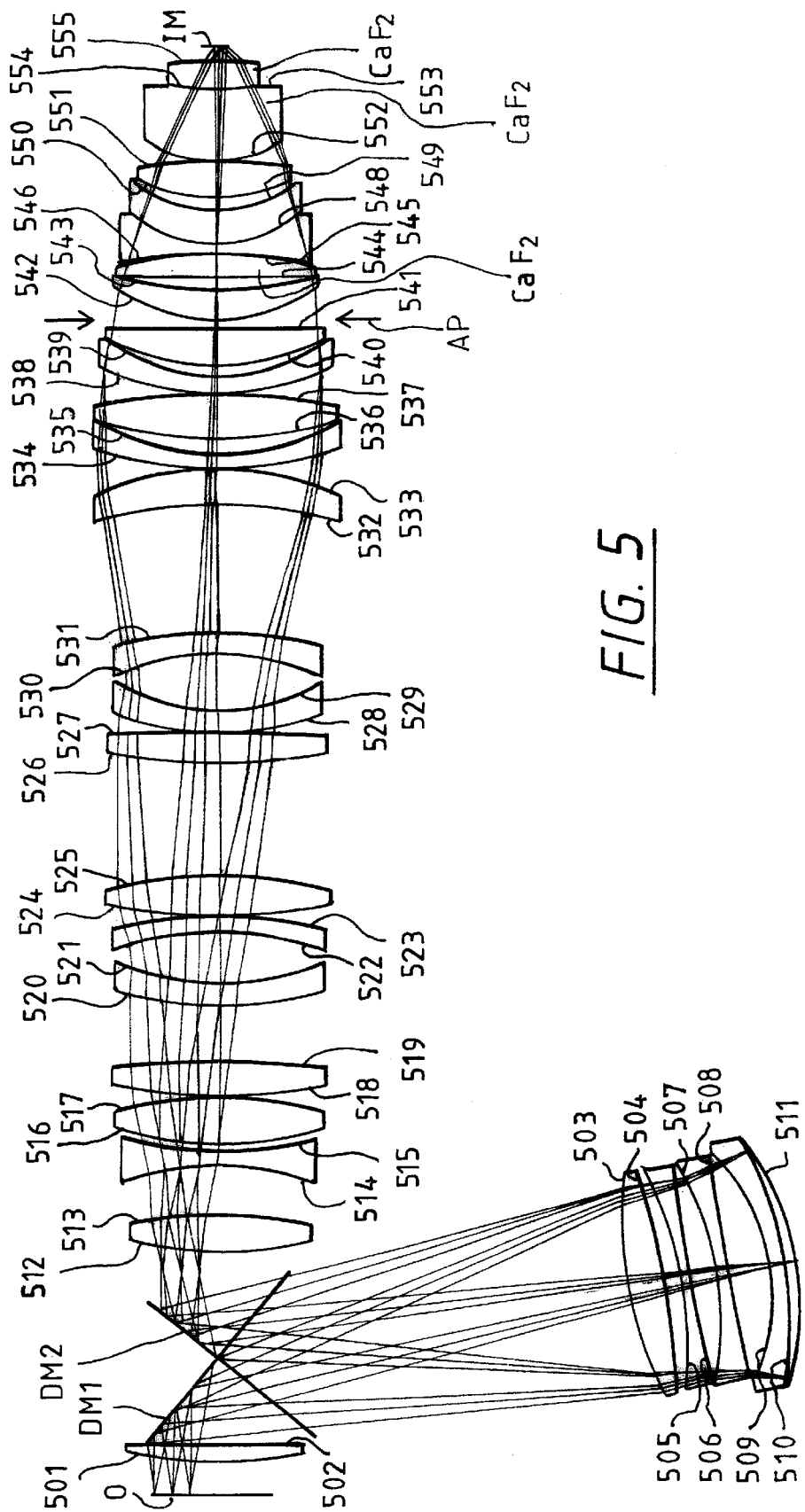
FIG. 5 is a section view of the lens arrangement of a fourth embodiment.

A fourth embodiment is given in FIG. 5 and table 4.

Now the catadioptric system CS again is free of any CaF$_2$ element. Its principal construction with a compact unit of one positive (503, 504), three negative lenses (505–510) and the concave mirror 511 in one compact unit remains the same as in the third embodiment. The reduction ratio $\beta_{cs}$ is 0.961 in the most preferred range.

Also the refractive lens RL is of the same overall design as the before mentioned examples. However, the use of CaF$_2$ lens elements has a novel character: While lens element 544, 545 in a known manner serves for achromatization, the reason for use of CaF$_2$ in the two lenses 552, 553; 554, 555 next to the image plane IM is another one:

The reason for use of CaF$_2$ here is the reduction of the "compaction" degradation effect which is rather strong with fused silica lenses at high light intensity and strong asymmetry (caused by narrow scanning image field) at 193 nm wavelength, but far less with CaF$_2$ lenses (or other crystalline material).

With an overall length—object 0 to image IM—of 1455 mm, a deviation off the axis of the concave mirror 511 of 590 mm, diameter of the concave mirror 511 of 250 mm, greatest lens diameter in the refractive lens system RL of 240 mm (at lens 534, 535) and diameters of the CaF$_2$ lenses of 195 mm (544, 545), 135 mm (552, 553) and 85 mm (554, 555) the dimensions of this construction are very acceptable. At Lambda=193 nm, 15 pm band width, reduction ratio 0.25, numerical aperture of 0.7, an image field of 26×9 mm$^2$ rectangular is imaged at a resolution of better than 0.20 μm.

Figure 6:
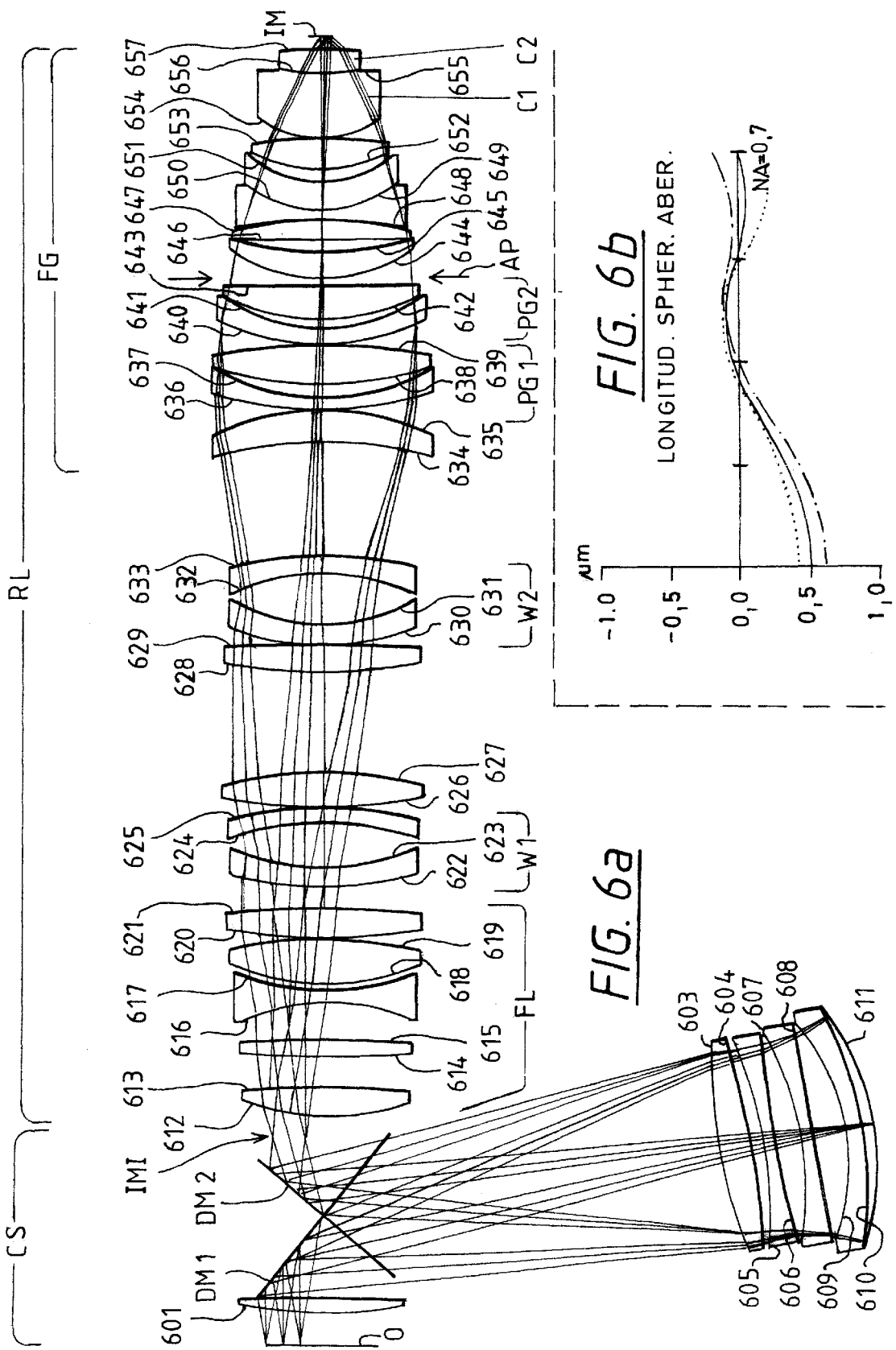
FIG. 6a is a section view of the lens arrangement of a fifth embodiment.
FIG. 6b is a representation of an imaging error of the fifth embodiment.

A fifth embodiment is given in FIG. 6a and table 5. This is distinguished from embodiment 4 in that only the last two lenses C1, C2 (654, 655; 656, 657) are made of CaF$_2$ with the aim of reduction of long-time degradation by compaction of fused silica under 193 nm radiation, but no CaF$_2$ is used for the purpose of achromatization.

The catadioptric system CS consists of a field lens 601, 602 with a focal length f' related to its distance B to the concave mirror by f'/B=1.004.

Deflecting mirror DM1 deflects the optical axis. Its normal is tilted with respect to the optical axis by 50°. This gives better beam clearance from the field lens 601, 602 than the normal 45°.

The positive lens 603, 604 is combined with three negative lenses 605–610 and the concave mirror 611 into a compact unit. The distance DM1-603 is 432 mm, compared to the distance DM1-611 to the concave mirror of 597 mm, this is 72%.

The reduction ratio of the catadioptric system $\beta_{cs}$=0.9608 lies in a preferable range near unity, where the achromatizing effect of the concave mirror is best exploited as well as other imaging errors (e.g. curvature of field) are kept small. The positive effect on Petzval sum is very good.

However, the concept of odd aberrations correction (Singh loc. cit.) is not adapted: At the intermediate image plane IMI the values of coma—0.1724—and distortion—-0.0833—by far exceed good correction values, while at the final image plane IM coma (−0.00098) and distortion (−0.000115) are very well corrected, as other typical errors are.

A field stop FS at the intermediate image plane IMI advantageously cuts off disturbing stray light.

According to the invention the catadioptric system is designed with very few elements in compact arrangement and its function is focussed on the implementation of the achromatizing and Petzval sum influence of the concave mirror 611.

Detailed correction is the realm of the refractive lens system RL. This is composed of a field lens group FL (surfaces 612 to 621) and a focussing lens group FG (surfaces 634 to 655). Correcting lens elements are inserted in between, including two pairs of opposing negative menisci 622–625 and 630–633. These form two beam waists W1, W2. Thus, the +−+−+ five lens group design known from sophisticated refractive projection exposure lenses is established.

The focussing lens group FG hosts the system aperture AP as well as two −+power lens groups PG1 and PG2 with the above mentioned advantages.

No achromatizing CaF$_2$ lens is provided, but as in embodiment 4 the two lenses C1, C2 (654–657) located next the image plane IM are made of CaF$_2$ for the above mentioned reason of avoidance of compaction.

At a length 0-IM of 1400 mm and a sideward deviation of 590 mm to the concave mirror 611, the diameter of the concave mirror 611 (and the neighboring lens 609, 610) is limited to 252 mm, while the largest lens 636, 637 of the refractive lens system RL has a diameter of 240 mm and the CaF$_2$ lenses have only 130 mm (C1) and 85 mm (C2) diameter. Thus requirements of production to avoid extreme diameters are well fulfilled.

FIG. 6b shows the longitudinal spherical aberration and its chromatic variation at Lambda=193.30 nm±0.015 nm for this embodiment 5, which as before mentioned is the remnant imaging error limiting the performance of this system.

It can be seen that with a moderately narrowed excimer laser source of Lambda=193.3 nm with 15 pm band width a rectangular field of 26×9 mm can be imaged at a resolution of better than 0.2 μm.

Figure 7:
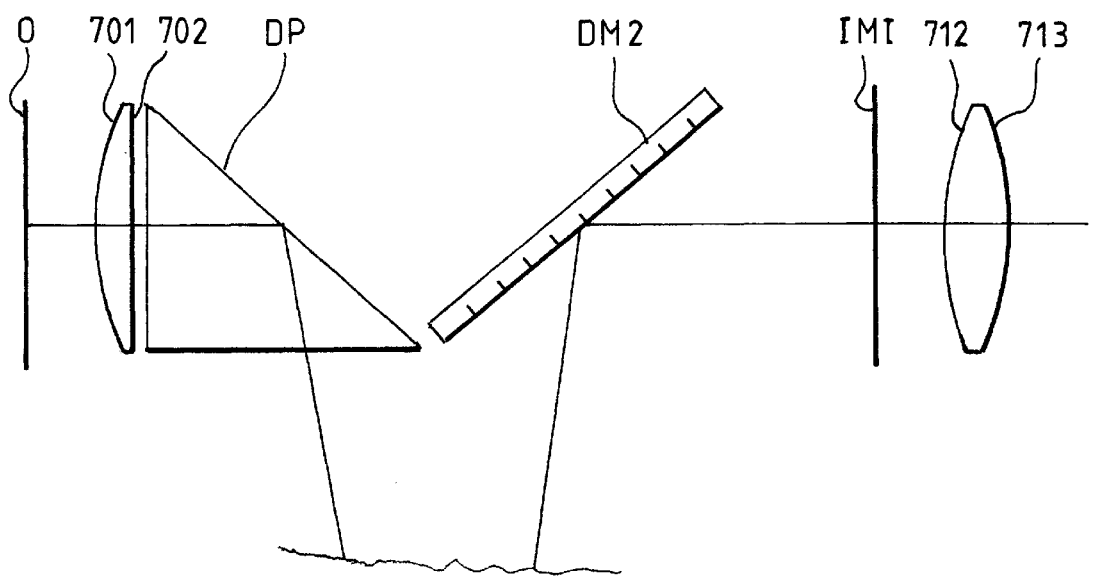
FIG. 7 is a schematic section view of part of the lens arrangement of a sixth embodiment.

A sixth embodiment is shown in FIG. 7 and table 6. Here, a deflecting prism DP is inserted for deflecting the light path towards the concave mirror 711.

Since the light rays inside the prism DP spread apart less than when they are in air (or nitrogen or helium), the field size can be increased by a certain amount without introducing any vignetting of the light rays by the prism edges. The importance of this design modification increases at higher numerical Aperture. Vignetting of rays limits how large a field size can be handled by the folding elements, and even a relatively small increase in field size is very desirable—for a variety of reasons, including the possibility of shrinking all lens diameters for a given field required. It turns out not to be relevant to try this for the second flat mirror DM2. While FIG. 7 schematically shows the deflecting mirror region, exemplary lens data for a full system are given in table 6. This Prism arrangement can also help to extend the free working distance or to use other mirror angles (e. g. 45°).

Embodiment 7, for which design data are given in table 7, shows the possible extension of the image with side numerical aperture well beyond the 0.7 value of the other examples. The value of NA=0.8 is not yet limiting to this type of lens. The overall construction is as given in the other embodiments, thus no extra drawing is needed for explanation.

Embodiment 8 with lens data of table 8 gives a pure CaF$_2$ design for 157 nm wavelength as an example showing the possibilities of the inventive design for use with VUV wavelengths. The overall construction is very much like FIG. 6a.

Other combinations of claimed features than explicitly described above are within the scope of the invention.

The possibilities of the Schupman achromat for achromatization with only one lens material are fully exploited in embodiments 1 and 8. In consequence, this embodiment 8 presents the first 157 nm design of the Schupman achromat suitable for VUV lithography. Insertion of aspheres and consequent reduction of number and thickness of lenses will further optimize this.

A new aspect of using a second material in a lens for avoiding compaction is given in embodiments 4 to 7.

To simplify achromatization by use of a second material very few elements made from this are sufficient as embodiments 3, 4, 6 and 7 show.

Preferably the lenses between the deflecting elements and the concave mirror are arranged in a compact unit with the latter as in embodiments 3 to 8. All lenses are more distant from the deflecting elements than from the concave mirror, their minimal distances do not exceed their maximum thicknesses (both taken over the diameter), or the length of the compact unit does not exceed its diameter, at least not by more than 50%. The sophisticated design of the refractive lens system as presented allows for good correction at increased image side numerical apertures in the 0.65 to 0.85 range.

While examples are given for the scanning scheme of exposure, the invention as well is useful with step-and-repeat or stitching. Stitching allows for specifically smaller optics.

TABLE 1

Lambda = 193,3 nm   β = 0,25   NA = 0,7

| No. | Radius | Thickness | Glass |
|---|---|---|---|
| 0 | Infinity | 40,000 | |
| 201 | 433,823 | 20,000 | SIO2 |
| 202 | Infinity | 76,000 | |
| DM1 | Infinity | 286,798 | Angle 50,5° |
| 203 | 371,257 | 25,000 | SIO2 |
| 204 | 855,824 | 216,212 | |
| 205 | −242,813 | 15,000 | SIO2 |
| 206 | −957,702 | 29,987 | |
| 207 | −191,563 | 15,000 | SIO2 |
| 208 | −420,744 | 12,000 | |
| 209 | 267,741 | | Reflector |
| (203) | | 281,798 | |
| DM2 | Infinity | 141,534 | Angle 39,5° |
| 210 | 341,605 | 45,000 | SIO2 |
| 211 | −302,390 | 0,266 | |
| 212 | −314,725 | 15,000 | SIO2 |
| 213 | −535,921 | 21,847 | |
| 214 | −293,712 | 15,000 | SIO2 |
| 215 | 242,074 | 2,808 | |
| 216 | 253,649 | 50,000 | SIO2 |
| 217 | −418,716 | 1,000 | |
| 218 | 387,621 | 32,000 | SIO2 |
| 219 | Infinity | 23,536 | |
| 220 | 338,439 | 20,000 | SIO2 |
| 221 | 180,073 | 56,252 | |
| 222 | −200,452 | 17,000 | SIO2 |
| 223 | −406,872 | 1,000 | |
| 224 | 830,485 | 35,000 | SIO2 |
| 225 | −406,246 | 137,396 | |
| 226 | 564,466 | 32,000 | SIO2 |
| 227 | −1292,800 | 1,000 | |
| 228 | 288,764 | 22,000 | SIO2 |
| 229 | 169,297 | 57,016 | |
| 230 | −189,642 | 28,572 | SIO2 |
| 231 | −398,135 | 81,777 | |
| 232 | −476,268 | 32,000 | SIO2 |
| 233 | −238,618 | 1,000 | |
| 234 | 505,684 | 17,000 | SIO2 |
| 235 | 259,770 | 13,056 | |
| 236 | 455,638 | 38,000 | SIO2 |
| 237 | −469,418 | 1,000 | |
| 238 | 236,178 | 15,000 | SIO2 |
| 239 = AP | 145,030 | 2,543 | |
| 240 | 149,636 | 45,000 | SIO2 |
| 241 | 1347,200 | 1,000 | |
| 242 | 138,086 | 29,000 | SIO2 |
| 243 | 273,919 | 16,837 | |
| 244 | −2450,800 | 36,643 | SIO2 |
| 245 | 114,868 | 12,598 | |
| 246 | 183,269 | 33,000 | SIO2 |
| 247 | −427,093 | 0,100 | |
| 248 | 119,177 | 56,567 | SIO2 |
| 249 | 352,582 | 0,100 | |
| 250 | 176,817 | 42,544 | SIO2 |
| 251 | −263,402 | 15,000 | |
| IM | Infinity | 0,000 | |

TABLE 2

Lambda = 193,3 nm   β = −0,25   NA = 0,7

| No. | Radius | Thickness | Glass |
|---|---|---|---|
| 0 | Infinity | 40,000 | |
| 301 | 501,959 | 20,000 | SIO2 |
| 302 | 6701,736 | 83,000 | |
| DM1 | Infinity | | Angle 53,00° |
| 303 | −477,089 | | SIO2 |
| 304 | −5445,982 | | |
| 305 | 282,396 | | SIO2 |
| 306 | 1204,642 | | |
| 307 | 216,126 | | SIO2 |

TABLE 2-continued

Lambda = 193,3 nm   β = –0,25   NA = 0,7

| No. | Radius | Thickness | Glass |
|---|---|---|---|
| 308 | 519,194 | | |
| 309 | 298,619 | | Reflector |
| (303) | | | |
| DM2 | Infinity | | Angle 37,00° |
| 310 | –277,399 | | SIO2 |
| 311 | 876,072 | | |
| 312 | 384,127 | | SIO2 |
| 313 | –245,187 | | |
| 314 | –297,630 | | SIO2 |
| 315 | 778,473 | | |
| 316 | –422,020 | | SIO2 |
| 317 | 945,111 | | |
| 318 | –336,194 | | SIO2 |
| 319 | –169,717 | | |
| 320 | 208,247 | | SIO2 |
| 321 | 414,789 | | |
| 322 | –639,842 | | SIO2 |
| 323 | 420,685 | | |
| 324 | –508,419 | | SIO2 |
| 325 | 1843,176 | | |
| 326 | –315,017 | | SIO2 |
| 327 | –182,247 | | |
| 328 | 197,495 | | SIO2 |
| 329 | 764,726 | | |
| 330 | 572,623 | | SIO2 |
| 331 | 246,349 | | |
| 332 | –592,087 | | SIO2 |
| 333 | –240,082 | | |
| 334 | –314,738 | | SIO2 |
| 335 | 745,437 | | |
| 336 | –219,102 | | SIO2 |
| 337 | –178,632 | | |
| 338 | –269,565 | | SIO2 |
| 339 = AP | –8665,509 | | |
| 340 | –165,739 | | SIO2 |
| 341 | –378,291 | | |
| 342 | –5121,046 | | CAF2 |
| 343 | 457,764 | | |
| 344 | 511,311 | | SIO2 |
| 345 | –143,061 | | |
| 346 | –134,125 | | SIO2 |
| 347 | –125,446 | | |
| 348 | –158,475 | | CAF2 |
| 349 | 451,948 | | |
| 350 | –122,592 | | SIO2 |
| 351 | –830,354 | | |
| 352 | –374,272 | | SIO2 |
| 353 | 500,000 | | |
| IM | Infinity | | |

TABLE 3

Lambda = 193,3 nm   β = –0,25   NA = 0,7

| No. | Radius | Thickness | Glass |
|---|---|---|---|
| 0 | Infinity | 40,000 | |
| 401 | 441,354 | 20,000 | SIO2 |
| 402 | –3082,575 | 82,000 | |
| DM1 | Infinity | 404,580 | Angle 51° |
| 403 | 379,755 | 40,000 | CAF2 |
| 404 | –503,571 | 10,819 | |
| 405 | –538,291 | 15,000 | SIO2 |
| 406 | –11216,000 | 23,000 | |
| 407 | –289,982 | 15,000 | SIO2 |
| 408 | 1481,373 | 35,434 | |
| 409 | –212,610 | 15,000 | SIO2 |
| 410 | –422,622 | 10,747 | |
| 411 | 281,484 | 10,747 | Reflector |
| (403) | | 391,580 | |
| DM2 | Infinity | 95,000 | Angle 39° |
| 412 | 304,777 | 35,000 | SIO2 |

TABLE 3-continued

Lambda = 193,3 nm   β = –0,25   NA = 0,7

| No. | Radius | Thickness | Glass |
|---|---|---|---|
| 413 | –414,139 | 36,096 | |
| 414 | –217,633 | 15,000 | SIO2 |
| 415 | 291,419 | 15,871 | |
| 416 | 372,431 | 48,000 | SIO2 |
| 417 | –351,209 | 1,000 | |
| 418 | 478,050 | 34,000 | SIO2 |
| 419 | –840,313 | 52,353 | |
| 420 | 336,231 | 20,000 | SIO2 |
| 421 | 175,364 | 55,562 | |
| 422 | –230,487 | 17,000 | SIO2 |
| 423 | –430,797 | 1,000 | |
| 424 | 648,294 | 40,000 | SIO2 |
| 425 | –404,757 | 99,810 | |
| 426 | 527,066 | 30,000 | SIO2 |
| 427 | –13296,000 | 1,000 | |
| 428 | 288,592 | 22,000 | SIO2 |
| 429 | 167,355 | 54,577 | |
| 430 | –201,179 | 20,000 | SIO2 |
| 431 | –801,011 | 103,872 | |
| 432 | –585,801 | 36,000 | SIO2 |
| 433 | –252,132 | 1,000 | |
| 434 | 457,102 | 17,000 | SIO2 |
| 435 | 260,610 | 9,580 | |
| 436 | 343,579 | 43,000 | SIO2 |
| 437 | –739,447 | 1,000 | |
| 438 | 226,319 | 18,500 | SIO2 |
| 439 | 173,228 | 16,103 | |
| 440 | 272,220 | 34,000 | SIO2 |
| 441 = AP | –7972,902 | 1,000 | |
| 442 | 165,067 | 34,000 | SIO2 |
| 443 | 374,040 | 12,889 | |
| 444 | 2219,918 | 22,000 | CAF2 |
| 445 | –490,695 | 0,100 | |
| 446 | –715,705 | 12,000 | SIO2 |
| 447 | 134,285 | 0,100 | |
| 448 | 123,907 | 36,879 | SIO2 |
| 449 | 111,965 | 9,498 | |
| 450 | 147,332 | 35,000 | CAF2 |
| 451 | –967,651 | 0,100 | |
| 452 | 115,241 | 69,555 | SIO2 |
| 453 | 921,256 | 0,100 | |
| 454 | 294,383 | 28,447 | SIO2 |
| 455 | –500,000 | 15,000 | |
| IM | Infinity | | |

TABLE 4

Lambda = 193,3 nm   β = –0,25   NA = 0,7

| No. | Radius | Thickness | Glass |
|---|---|---|---|
| 0 | Infinity | 35,000 | |
| 501 | 407,048 | 16,000 | SIO2 |
| 502 | –85814,000 | 82,000 | |
| DM1 | Infinity | 431,676 | Angle 50° |
| 503 | 524,134 | 35,000 | SIO2 |
| 504 | –657,304 | 8,785 | |
| 505 | –587,479 | 15,000 | SIO2 |
| 506 | 1940,811 | 25,643 | |
| 507 | –324,153 | 15,000 | SIO2 |
| 508 | –23676,000 | 37,709 | |
| 509 | –201,728 | 15,000 | SIO2 |
| 510 | –422,094 | 12,854 | |
| 511 | 282,375 | | Reflector |
| (503) | | 422,676 | |
| DM2 | Infinity | 110,772 | Angle 40° |
| 512 | 373,692 | 35,000 | SIO2 |
| 513 | –410,297 | 50,772 | |
| 514 | –222,817 | 15,000 | SIO2 |
| 515 | 317,101 | 6,370 | |
| 516 | 349,335 | 48,000 | SIO2 |
| 517 | –362,479 | 1,000 | |

TABLE 4-continued

Lambda = 193,3 nm   β = −0,25   NA = 0,7

| No. | Radius | Thickness | Glass |
|---|---|---|---|
| 518 | 729,698 | 34,000 | SIO2 |
| 519 | −931,019 | 57,653 | |
| 520 | 371,363 | 20,000 | SIO2 |
| 521 | 210,389 | 53,764 | |
| 522 | −248,647 | 17,000 | SIO2 |
| 523 | −428,501 | 1,000 | |
| 524 | 937,198 | 40,000 | SIO2 |
| 525 | −388,007 | 113,824 | |
| 526 | 567,461 | 30,000 | SIO2 |
| 527 | −4351,070 | 1,000 | |
| 528 | 282,352 | 22,000 | SIO2 |
| 529 | 185,586 | 56,362 | |
| 530 | −234,431 | 20,000 | SIO2 |
| 531 | −557,904 | 132,665 | |
| 532 | −408,165 | 35,442 | SIO2 |
| 533 | −266,966 | 1,000 | |
| 534 | 404,076 | 17,000 | SIO2 |
| 535 | 238,987 | 14,763 | |
| 536 | 379,049 | 43,000 | SIO2 |
| 537 | −737,556 | 1,000 | |
| 538 | 245,637 | 18,500 | SIO2 |
| 539 | 178,878 | 12,206 | |
| 540 | 245,508 | 34,000 | SIO2 |
| 541 | 2061,364 | 10,000 | |
| AP | Infinity | 0,000 | |
| 542 | 168,071 | 34,000 | SIO2 |
| 543 | 473,781 | 9,798 | |
| 544 | 1851,461 | 22,000 | CAF2 |
| 545 | −494,253 | 0,100 | |
| 546 | −719,297 | 12,000 | SIO2 |
| 547 | 132,814 | 0,100 | |
| 548 | 127,155 | 34,780 | SIO2 |
| 549 | 118,260 | 11,187 | |
| 550 | 169,575 | 35,000 | SIO2 |
| 551 | −844,545 | 0,100 | |
| 552 | 111,623 | 74,968 | CAF2 |
| 553 | 1756,460 | 0,100 | |
| 554 | 239,829 | 26,117 | CAF2 |
| 555 | −500,000 | 15,000 | |
| IM | Infinity | 0,000 | |

TABLE 5

Lambda = 193,3 nm   β = −0,25   NA = 0,7

| No. | Radius | Thickness | Glass |
|---|---|---|---|
| 0 | Infinity | 35,000 | |
| 601 | 443,397 | 16,000 | SIO2 |
| 602 | −3263,101 | 82,000 | |
| DM1 | Infinity | 431,967 | Angle 50° |
| 603 | 510,641 | 35,000 | SIO2 |
| 604 | −953,685 | 12,327 | |
| 605 | −534,546 | 15,000 | SIO2 |
| 606 | 1546,359 | 27,623 | |
| 607 | −295,422 | 15,000 | SIO2 |
| 608 | −1911,545 | 32,819 | |
| 609 | −212,072 | 15,000 | SIO2 |
| 610 | −404,269 | 12,229 | |
| 611 | 279,883 | | Reflector |
| (603) | | 422,967 | |
| DM2 | Infinity | 109,448 | Angle 40° |
| 612 | 338,847 | 28,000 | SIO2 |
| 613 | −769,850 | 31,900 | |
| 614 | 1373,814 | 18,000 | SIO2 |
| 615 | −915,108 | 37,909 | |
| 616 | −239,573 | 15,000 | SIO2 |
| 617 | 279,202 | 6,538 | |
| 618 | 301,416 | 46,477 | SIO2 |
| 619 | −437,969 | 1,000 | |
| 620 | 722,212 | 30,074 | SIO2 |
| 621 | −1063,807 | 23,211 | |

TABLE 5-continued

Lambda = 193,3 nm   β = −0,25   NA = 0,7

| No. | Radius | Thickness | Glass |
|---|---|---|---|
| 622 | 381,419 | 19,000 | SIO2 |
| 623 | 193,859 | 52,872 | |
| 624 | −235,061 | 17,000 | SIO2 |
| 625 | −412,453 | 1,000 | |
| 626 | 990,052 | 40,000 | SIO2 |
| 627 | −337,530 | 95,112 | |
| 628 | 529,636 | 30,000 | SIO2 |
| 629 | −0,208 | 1,000 | |
| 630 | 264,737 | 20,000 | SIO2 |
| 631 | 173,477 | 55,898 | |
| 632 | −213,164 | 19,000 | SIO2 |
| 633 | −478,343 | 127,971 | |
| 634 | −384,253 | 29,998 | SIO2 |
| 635 | −241,972 | 1,000 | |
| 636 | 381,178 | 17,000 | SIO2 |
| 637 | 218,858 | 11,314 | |
| 638 | 296,282 | 43,000 | SIO2 |
| 639 | −966,118 | 1,000 | |
| 640 | 230,570 | 18,500 | SIO2 |
| 641 | 172,880 | 14,657 | |
| 642 | 271,493 | 30,000 | SIO2 |
| 643 | −49526,000 | 4,000 | |
| AP | Infinity | 0,000 | |
| 644 | 156,048 | 36,000 | SIO2 |
| 645 | 474,860 | 12,986 | |
| 646 | −4892,676 | 20,000 | SIO2 |
| 647 | −452,665 | 0,100 | |
| 648 | −711,904 | 34,541 | SIO2 |
| 649 | 122,051 | 9,933 | |
| 650 | 171,475 | 33,021 | SIO2 |
| 651 | −967,318 | 0,100 | |
| 652 | 112,494 | 72,297 | CAF2 |
| 653 | 3642,643 | 0,100 | |
| 654 | 250,427 | 26,033 | CAF2 |
| 655 | −500,000 | 15,000 | |
| IM | Infinity | 0,000 | |

TABLE 6

Lambda = 193,3 nm   β = −0,25   NA = 0,7

| No. | Radius | Thickness | Glass |
|---|---|---|---|
| 0 | Infinity | 35,000 | |
| 701 | 396,818 | 16,000 | SIO2 |
| 702 | −411120,000 | 1,000 | |
| DP | Infinity | 85,500 | SIO2 |
| DP | Infinity | 435,933 | Angle 50° |
| 703 | 559,897 | 35,000 | SIO2 |
| 704 | −763,942 | 2,707 | |
| 705 | −627,112 | 15,000 | SIO2 |
| 706 | 2056,900 | 24,065 | |
| 707 | −323,749 | 15,000 | SIO2 |
| 708 | −4114,500 | 41,268 | |
| 709 | −197,452 | 15,000 | SIO2 |
| 710 | −416,693 | 13,024 | |
| 711 | 278,696 | | Reflector |
| (703) | | 420,933 | |
| DM2 | Infinity | 84,857 | Angle 40° |
| 712 | 391,689 | 35,000 | SIO2 |
| 713 | −391,139 | 54,674 | |
| 714 | −217,120 | 15,000 | SIO2 |
| 715 | 328,292 | 6,584 | |
| 716 | 363,974 | 48,000 | SIO2 |
| 717 | −352,092 | 11,973 | |
| 718 | 753,003 | 34,000 | SIO2 |
| 719 | −915,634 | 62,045 | |
| 720 | 369,054 | 20,000 | SIO2 |
| 721 | 218,165 | 56,274 | |
| 722 | −247,872 | 17,000 | SIO2 |
| 723 | −420,231 | 1,000 | |
| 724 | 970,166 | 40,000 | SIO2 |

TABLE 6-continued

Lambda = 193,3 nm  β = −0,25  NA = 0,7

| No. | Radius | Thickness | Glass |
|---|---|---|---|
| 725 | −383,655 | 110,429 | |
| 726 | 556,298 | 30,000 | SIO2 |
| 727 | −5145,200 | 1,000 | |
| 728 | 275,093 | 22,000 | SIO2 |
| 729 | 186,724 | 57,861 | |
| 730 | −249,939 | 24,499 | SIO2 |
| 731 | −573,695 | 138,278 | |
| 732 | −424,514 | 35,114 | SIO2 |
| 733 | −274,834 | 1,000 | |
| 734 | 391,263 | 17,000 | SIO2 |
| 735 | 226,128 | 16,728 | |
| 736 | 383,272 | 43,000 | SIO2 |
| 737 | −863,203 | 1,000 | |
| 738 | 239,284 | 18,500 | SIO2 |
| 739 | 178,197 | 11,299 | |
| 740 | 237,727 | 34,000 | SIO2 |
| 741 | 1618,000 | 10,000 | |
| AP | Infinity | 0,000 | |
| 742 | 165,688 | 34,000 | SIO2 |
| 743 | 445,266 | 9,217 | |
| 744 | 1247,900 | 22,000 | CAF2 |
| 745 | −503,423 | 0,000 | |
| 746 | −771,731 | 12,000 | SIO2 |
| 747 | 131,678 | 0,100 | |
| 748 | 124,872 | 29,133 | SIO2 |
| 749 | 115,885 | 13,283 | |
| 750 | 179,986 | 35,000 | SIO2 |
| 751 | −802,711 | 0,100 | |
| 752 | 110,497 | 77,422 | CAF2 |
| 753 | 2393,500 | 0,100 | |
| 754 | 234,953 | 25,804 | CAF2 |
| 755 | −500,000 | 15,000 | |
| IM | Infinity | 0,000 | |

TABLE 7

Lambda = 193 nm  β = −0,25  NA = 0,8

| No. | Radius | Thickness | Glass |
|---|---|---|---|
| 0 | Infinity | 35,000 | |
| 801 | 355,625 | 15,000 | SIO2 |
| 802 | Infinity | 84,000 | |
| DM1 | Infinity | 393,919 | Angle 50° |
| 803 | 621,321 | 30,000 | SIO2 |
| 804 | 17349,000 | 15,577 | |
| 805 | −522,771 | 15,000 | SIO2 |
| 806 | 7450,061 | 28,795 | |
| 807 | −279,969 | 15,000 | SIO2 |
| 808 | −692,552 | 26,633 | |
| 809 | −231,205 | 15,000 | SIO2 |
| 810 | −419,760 | 13,994 | |
| 811 | 283,256 | | Reflector |
| (803) | | 384,919 | |
| DM2 | Infinity | 103,131 | Angle 40° |
| 812 | 363,520 | 35,000 | SIO2 |
| 813 | −312,546 | 19,745 | |
| 814 | −203,460 | 15,000 | SIO2 |
| 815 | 417,901 | 4,913 | |
| 816 | 637,371 | 44,999 | SIO2 |
| 817 | −299,660 | 1,000 | |
| 818 | 670,513 | 36,000 | SIO2 |
| 819 | −607,949 | 99,443 | |
| 820 | 409,543 | 20,000 | SIO2 |
| 821 | 184,175 | 56,726 | |
| 822 | −190,739 | 18,000 | SIO2 |
| 823 | −300,666 | 1,000 | |
| 824 | 2541,548 | 35,000 | SIO2 |
| 825 | −423,211 | 82,343 | |
| 826 | 529,976 | 40,000 | SIO2 |
| 827 | −575,433 | 1,000 | |
| 828 | 338,904 | 22,000 | SIO2 |

TABLE 7-continued

Lambda = 193 nm  β = −0,25  NA = 0,8

| No. | Radius | Thickness | Glass |
|---|---|---|---|
| 829 | 161,992 | 77,036 | |
| 830 | −180,232 | 20,000 | SIO2 |
| 831 | −286,886 | 60,230 | |
| 832 | 1358,390 | 50,000 | SIO2 |
| 833 | −310,335 | 1,000 | |
| 834 | 299,546 | 17,000 | SIO2 |
| 835 | 185,330 | 22,475 | |
| 836 | 318,393 | 15,000 | SIO2 |
| 837 | 240,343 | 11,470 | |
| 838 | 351,936 | 35,000 | SIO2 |
| 839 | −1892,972 | 1,000 | |
| 840 | 241,744 | 18,500 | SIO2 |
| 841 | 201,167 | 6,992 | |
| 842 | 233,761 | 35,000 | SIO2 |
| 843 | 1187,547 | 0,000 | |
| AP | Infinity | 6,993 | |
| 844 | 173,633 | 65,000 | CAF2 |
| 845 | −647,630 | 0,100 | |
| 846 | −1026,314 | 15,000 | SIO2 |
| 847 | 134,041 | 12,672 | |
| 848 | 177,508 | 43,000 | SIO2 |
| 849 | −552,796 | 0,100 | |
| 850 | 111,087 | 82,051 | CAF2 |
| 851 | 366,445 | 0,100 | |
| 852 | 201,556 | 9,977 | CAF2 |
| 853 | Infinity | 15,000 | |
| IM | Infinity | | |

TABLE 8

Lambda 157,000 nm ± 2 pm  NA = 0,7  β = −0,25

| No. | Radius | Thickness | Glass |
|---|---|---|---|
| 0 | Infinity | 35,000 | |
| 901 | 509,596 | 16,000 | CAF2 |
| 902 | −1709,182 | 82,000 | |
| DM1 | Infinity | 430,770 | Angle 50° |
| 903 | 559,504 | 35,000 | CAF2 |
| 904 | −1229,460 | 18,117 | |
| 905 | −727,847 | 15,000 | CAF2 |
| 906 | 1261,260 | 27,332 | |
| 907 | −297,498 | 15,000 | CAF2 |
| 908 | −1565,150 | 32,707 | |
| 909 | −205,835 | 15,000 | CAF2 |
| 910 | −396,253 | 12,181 | |
| 911 | 279,103 | Reflector | φ 252 mm |
| (903) | | 420,578 | |
| DM2 | Infinity | 73,026 | Angle 40° |
| IMI | Infinity | 34,034 | |
| 912 | 341,070 | 28,000 | CAF2 |
| 913 | −1505,473 | 32,408 | |
| 914 | 969,048 | 18,000 | CAF2 |
| 915 | −805,764 | 37,523 | |
| 916 | −248,947 | 15,000 | CAF2 |
| 917 | 286,272 | 5,893 | |
| 918 | 307,931 | 45,973 | CAF2 |
| 919 | −386,903 | 1,000 | |
| 920 | 1003,377 | 28,290 | CAF2 |
| 921 | −945,839 | 20,042 | |
| 922 | 397,781 | 19,000 | CAF2 |
| 923 | 197,943 | 53,200 | |
| 924 | −231,060 | 17,000 | CAF2 |
| 925 | −406,748 | 1,000 | |
| 926 | 878,953 | 40,000 | CAF2 |
| 927 | −351,000 | 100,639 | |
| 928 | 481,080 | 30,000 | CAF2 |
| 929 | 11551,730 | 1,000 | |
| 930 | 282,768 | 20,000 | CAF2 |
| 931 | 179,880 | 51,341 | |
| 932 | −217,737 | 19,000 | CAF2 |
| 933 | −511,417 | 127,776 | |

TABLE 8-continued

Lambda 157,000 nm ± 2 pm   NA = 0,7   β = −0,25

| No. | Radius | Thickness | Glass |
|---|---|---|---|
| 934 | −377,857 | 29,786 | φ240 mm CAF2 |
| 935 | −241,099 | 1,000 | |
| 936 | 377,020 | 17,000 | CAF2 |
| 937 | 218,220 | 11,262 | |
| 938 | 299,020 | 43,000 | CAF2 |
| 939 | −943,927 | 1,000 | |
| 940 | 228,020 | 18,500 | CAF2 |
| 941 | 168,921 | 13,866 | |
| 942 | 263,149 | 30,000 | CAF2 |
| 943 | −27570,214 | 0,752 | |
| AP | Infinity | 8,754 | |
| 944 | 157,192 | 36,000 | CAF2 |
| 945 | 476,977 | 13,281 | |
| 946 | −5291,918 | 20,000 | CAF2 |
| 947 | −428,700 | 0,100 | |
| 948 | −634,165 | 34,624 | CAF2 |
| 949 | 123,520 | 10,454 | |
| 950 | 180,781 | 33,303 | CAF2 |
| 951 | −732,821 | 0,100 | |
| 952 | 115,913 | 72,125 | CAF2 |
| 953 | 3615,409 | 0,100 | |
| 954 | 308,142 | 25,802 | CAF2 |
| 955 | −500,000 | 15,000 | |
| IM | Infinity | | |

Refractive Indices CaF$_2$
Lambda = 157,002  157,000  156,998
n = 1,560047  1,560052  1,560057

We claim:

1. A projection exposure lens system, comprising:
an object side catadioptric system,
an intermediate image, and
a refractive lens system, with lenses made of a first material and lenses made of a second material,
in which no more than four lenses are made of said second material.

2. The projection exposure lens system according to claim 1, in which no more than three lenses are made of said second material.

3. A projection exposure lens system, according to claim 1, in which said catadioptric system has at least one deflecting element, a concave mirror and a plurality of lenses between said at least one deflecting element and said concave mirror, and in which said concave mirror and all lenses arranged between said deflecting element and said concave mirror are arranged in a compact unit.

4. A projection exposure lens system, according to claim 1, in which said catadioptric system has at least one deflecting element, a concave mirror and a plurality of lenses, and in which said catadioptric system has at least one positive lens between said object side and a first deflecting element, and not more than one positive and not more than three negative lenses between said first deflecting element and said concave mirror.

5. A projection exposure lens system according to claim 1, in which said refractive lens system from its intermediate image side and in the direction of its image plane has
a first lens group of positive refractive power,
a second lens group of negative refractive power,
a third lens group of positive refractive power,
a fourth lens group of negative refractive power, and
a fifth lens group of positive refractive power.

6. A projection exposure lens system according to claim 1, in which at least one −+ power doublet with a negative power lens and a positive power lens in this sequence from said object side is arranged in said refractive lens system.

7. A projection exposure lens system according to claim 1, in which said refractive lens system comprises a field lens group, an intermediate correcting lens group and a focussing lens group.

8. A projection exposure lens system according to claim 1, in which said catadioptric system has an imaging ratio of greater than 0.95, and different from unity.

9. The projection exposure lens system according to claim 1, in which said refractive lens system contains at least a pair of menisci, the convex surface of an intermediate-image-side meniscus facing said intermediate image, the convex surface of the other menisci facing oppositely.

10. The projection exposure lens system according to claim 9, in which said at least one pair of menisci is arranged in a correcting lens group.

11. The projection exposure lens system according to claim 7, in which one of said −+ power doublets is arranged in a focussing lens group.

12. The projection exposure lens system according to claim 7, in which one of said −+ power doublets is arranged next to a system aperture.

13. The projection exposure lens system according to claim 1, in which no more than one lens of said catadioptric system is made of said second lens material.

14. The projection exposure lens system according to claim 1, in which the diameter of lenses made of said second lens material does not exceed the 0.85 fold of the diameter of a biggest optical element.

15. The projection exposure lens system according to claim 1, in which the diameter of lenses made of said second lens material does not exceed 220 mm.

16. The projection exposure lens system according to claim 1, in which said catadioptric system contains no more than six lenses.

17. The projection lens system according to claim 16, in which said catadioptric system contains no more than five lenses.

18. The projection exposure lens system according to claim 1, in which longitudinal chromatic aberration is less than 0.015 μm per a band width of 1 pm at 193 nm.

19. The projection exposure lens system according to claim 1, in which longitudinal chromatic aberration is less than 0.05 μm per a band width of 1 pm at 157 nm.

20. The projection exposure lens system according to claim 1, in which the imaging ratio of said catadioptric system is greater than 0.8.

21. The projection exposure lens system according to claim 21, in which said imaging ratio of said catadioptric system is greater than 0.95.

22. The projection exposure lens according to claim 1, in which in said refractive lens system all lenses made of said second lens material are arranged in a converging light beam next to an image plane.

23. The projection exposure lens system according to claim 1, in which said projection exposure lens system is both side telecentric.

24. The projection exposure lens system according to claim 7, having at least one beam waist in a refracting subsystem, and said −+ power doublets are arranged behind a last beam waist.

25. The projection exposure lens system according to claim 7, in which said −+ doublets are arranged such that a light beam diameter inside lens elements of said −+doublets is more than 80% of a maximum beam diameter.

26. The projection exposure lens system according to claim 1, further comprising a concave mirror in said catadioptric system, and a reflecting prism inserted for reflection of a light beam between an object and said concave mirror.

27. The projection exposure lens system according to claim 1, in which said projection exposure lens system is designed for use with one of 248 nm and 193 nm light and said first material comprises fused silica and said second material comprises calcium fluoride.

28. The projection exposure lens system according to claim 1, in which said first material comprises calcium fluoride.

29. The projection exposure lens system according to claim 1, further comprising a first deflecting element in said catadioptric system, in which exactly one lens is placed between an object and said first deflecting element.

30. The projection exposure lens system according to claim 29, in which the ratio of focal length of said one lens before said first deflecting mirror over the distance from said one lens to said concave mirror is unity within (+/−) fifteen percent.

31. A projection exposure apparatus, comprising:

a projection exposure lens system according to claim 1, an excimer laser light source, an illuminating system, a mask handling and positioning system, and a wafer handling and positioning system.

32. A method of producing microstructured devices by lithography comprising using a projection exposure apparatus according to claim 31.

33. The method according to claim 32, further comprising using one of step and repeat, scanning, and stitching exposure schemes.

* * * * *